(12) United States Patent
Howard et al.

(10) Patent No.: US 7,615,164 B2
(45) Date of Patent: *Nov. 10, 2009

(54) PLASMA ETCHING METHODS AND CONTACT OPENING FORMING METHODS

(75) Inventors: Bradley J. Howard, Livermore, CA (US); Max F. Hineman, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 243 days.

This patent is subject to a terminal disclaimer.

(21) Appl. No.: 10/875,330

(22) Filed: Jun. 23, 2004

(65) Prior Publication Data

US 2005/0284843 A1    Dec. 29, 2005

(51) Int. Cl.
*H01L 21/302* (2006.01)

(52) U.S. Cl. .............................. 216/67; 216/13; 216/17; 216/18; 216/38; 438/700; 438/714; 438/723; 438/734

(58) Field of Classification Search .................... 216/67
See application file for complete search history.

(56) References Cited

U.S. PATENT DOCUMENTS

| | | | |
|---|---|---|---|
| 6,433,297 B1 * | 8/2002 | Kojima et al. .......... | 219/121.43 |
| 6,642,149 B2 * | 11/2003 | Suemasa et al. .............. | 438/710 |
| 6,716,763 B2 * | 4/2004 | Li et al. ....................... | 438/711 |
| 6,753,264 B2 * | 6/2004 | Li et al. ....................... | 438/714 |
| 6,861,373 B2 * | 3/2005 | Aoki et al. ................... | 438/761 |
| 6,930,047 B2 * | 8/2005 | Yamazaki et al. ........... | 438/706 |
| 7,122,480 B2 * | 10/2006 | Li et al. ....................... | 438/714 |
| 2002/0020497 A1 * | 2/2002 | Ohmi et al. .................. | 156/345 |
| 2004/0000875 A1 * | 1/2004 | Vahedi et al. .......... | 315/111.71 |
| 2004/0097079 A1 * | 5/2004 | Mimura et al. .............. | 438/689 |
| 2005/0090118 A1 * | 4/2005 | Shannon et al. ............. | 438/706 |
| 2006/0252198 A1 * | 11/2006 | Li et al. ....................... | 438/225 |

* cited by examiner

*Primary Examiner*—Anita K Alanko
(74) *Attorney, Agent, or Firm*—Wells St. John P.S.

(57) ABSTRACT

The invention includes etching and contact opening forming methods. In one implementation, a plasma etching method includes providing a bottom powered plasma chamber that includes a plasma generating electrode powerable at different first and second frequencies, with the first frequency being lower than the second frequency. A substrate is positioned over the electrode. A plasma is generated over the substrate with the electrode from a first applied power at the first frequency and a second applied power at the second frequency. A ratio of the first applied power to the second applied power is from 0 to 0.25 or at least 6.0. Material is etched from the substrate with the plasma.

12 Claims, 4 Drawing Sheets

PLASMA ETCHING METHODS AND CONTACT OPENING FORMING METHODS

TECHNICAL FIELD

The present invention relates to plasma etching methods and to contact opening forming methods.

BACKGROUND OF THE INVENTION

In the fabricating of integrated circuitry, different elevation conductive and/or semiconductive layers are commonly separated by insulative layers. Electrical connections are commonly made between different elevation devices by forming contact openings through an insulating layer prior to forming the higher elevation devices. Such openings are typically formed through a masking layer using an anisotropic plasma etching technique. One particular class of tools for doing so is known as a bottom powered, dual frequency etch system. It has been found in certain instances when operating such systems in the manner recommended by the manufacturer that electrical characteristics of the fabricated circuitry were being shifted or changed in undesirable manners. One discovered adverse effect was a decrease in the field threshold voltage. This is a measurement of the voltage required to form undesired parasitic field effect transistors across field isolation on the substrate. It is typically desirable that this voltage be as high as possible to avoid the formation of such parasitic devices.

An exemplary plasma etch apparatus and data from semiconductors processed according to the prior art are shown in FIGS. 1-3. Referring to FIG. 1, an exemplary bottom powered dual frequency plasma etch apparatus is shown. Apparatus 10 includes a bottom powered electrode 12 and a top unpowered, grounded electrode 14. Electrode 12 has dual frequency power sources of 2 and 27 MHz respectively. An exemplary apparatus 10 is the Exelan system produced by LAM Research Corporation of Freemont, Calif., which is a bottom powered dual frequency etch system. During plasma etch, this system is powered simultaneously at 2 MHz and 27 MHz with substantially balanced or equal powers. For example, these powers are typically run at greater than 1000 watts each, with a power ratio from 0.6 to 1.67 of the 2 MHz frequency to the 27 MHz frequency (2 MHz:27 MHz).

Semiconductor substrates processed under these conditions can develop low field threshold voltages, as well as other adverse effects such as inadequate refresh times. FIGS. 2 and 3 illustrate the low field threshold values of semiconductor substrates processed in accordance with these prior art methods. Referring to FIG. 2, at high total power (3050 watts) and low frequency ratio of 0.65, the field threshold voltage was 5.92. Likewise, as illustrated in FIG. 3, at a total power of approximately 3050 watts and a high frequency ratio of about 1.6, the field threshold voltage was 5.52. It is preferred to maintain the total power as high as possible to increase etch rates, thereby processing substrates in a more rapid manner.

While the invention was motivated by addressing the above issues and challenges, it is, of course, in no way so limited. This invention is only limited by the accompanying claims as literally worded and appropriately interpreted in accordance with the doctrine of equivalents.

SUMMARY OF THE INVENTION

The invention includes etching and contact opening forming methods. In one implementation, a plasma etching method includes providing a bottom powered plasma chamber that includes a plasma generating electrode powerable at different first and second frequencies, with the first frequency being lower than the second frequency. A substrate is positioned over the electrode. A plasma is generated over the substrate with the electrode from a first applied power at the first frequency and a second applied power at the second frequency. A ratio of the first applied power to the second applied power is from 0 to 0.25 or at least 6.0. Material is etched from the substrate with the plasma.

In one implementation, a method of forming contact openings includes providing a bottom powered plasma chamber comprising a plasma generating electrode powerable at different first and second frequencies, with the first frequency being lower than the second frequency. A substrate is positioned over the electrode. The substrate includes an insulative layer received over conductive or semiconductive material. A patterned masking layer having openings therein for defining contact openings is received over the insulative layer. The insulative layer includes an outermost portion and an innermost portion proximate the conductive or semiconductive material. Contact openings are formed through the insulative layer to the conductive or semiconductive material using the patterned masking layer by first removing the outermost portion effective to expose the innermost portion. Then, the innermost portion is plasma etched effective to expose the conductive or semiconductive material. Plasma may or may not be used in removing the outermost portion. Regardless, the plasma used to etch the innermost portion is generated with the electrode from a first applied power at the first frequency and second applied power at the second frequency. A ratio of the first applied power to the second applied power is from 0 to 0.25 or at least 6.0.

Other aspects and implementations are contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 4:
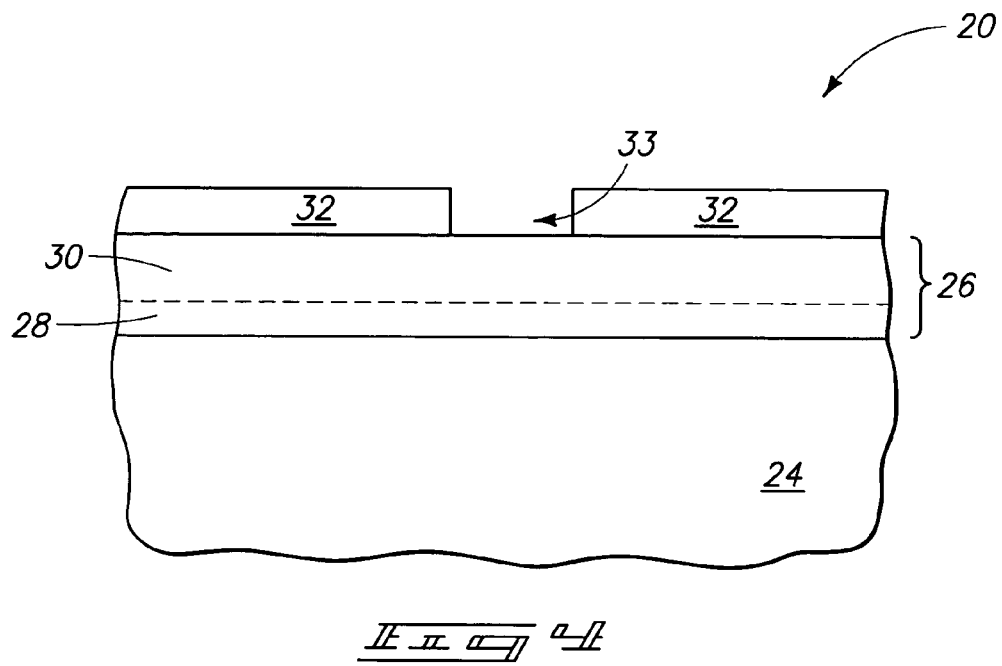
FIG. 4 is a diagrammatic cross-sectional view of a substrate in process in accordance with an aspect of the invention.

An exemplary plasma etching method in accordance with aspects of the present invention is described with reference to FIGS. 4-7. Referring to FIG. 4, a substrate 20 includes conductive or semiconductive material 24 having insulative material 26 thereover. In the illustrated embodiment, substrate 20 includes a patterned masking layer 32 formed over insulative material 26 to be used as a mask in etching material 26.

The term "substrate" refers to any supporting structure, including, but not limited to the conductive and semiconductive materials described herein. Semiconductive material can include any construction comprising semiconductive material, including, but not limited to, bulk semiconductive materials such as a semiconductive wafer (either alone or in assemblies comprising other materials thereon), and semiconductive material layers (either alone or in assemblies comprising other materials). Material 24 can include semiconductive materials, for example polysilicon. In one implementation, material 24 can include conductive materials, for example metals such as copper, other elemental metals and alloys, or conductive metal compounds. An exemplary preferred material 26 comprises $SiO_2$, for example borophosphosilicate glass. Insulative material 26 can also include multiple insulative materials and/or layers.

In one implementation, insulative material 26 can be considered as having an innermost portion 28 proximate material 24 and having an outermost portion 30. In the illustrated embodiment, innermost portion 28 and outermost portion 30 of insulative material 26 can comprise the entire thickness of insulative material 26. In an exemplary aspect, a thickness of outermost portion 30 is at least five times the thickness of innermost portion 28. In another exemplary aspect, the thickness of outermost portion 30 is at least nine times the thickness of innermost portion 28. A specific example thickness for innermost portion 28 is from 1,000 Å to 2,000 Å, with that for outermost portion 30 being from 18,000 Å to 19,000 Å.

Figure 5:
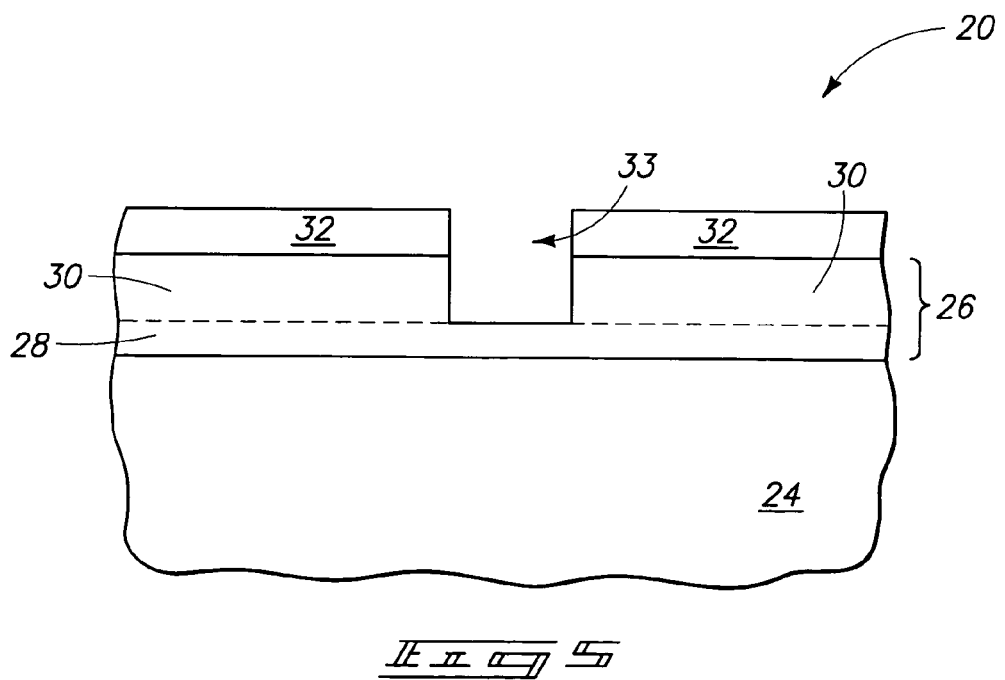
FIG. 5 is a view of the FIG. 4 substrate at a processing stage subsequent to that of FIG. 4.
Figure 6:
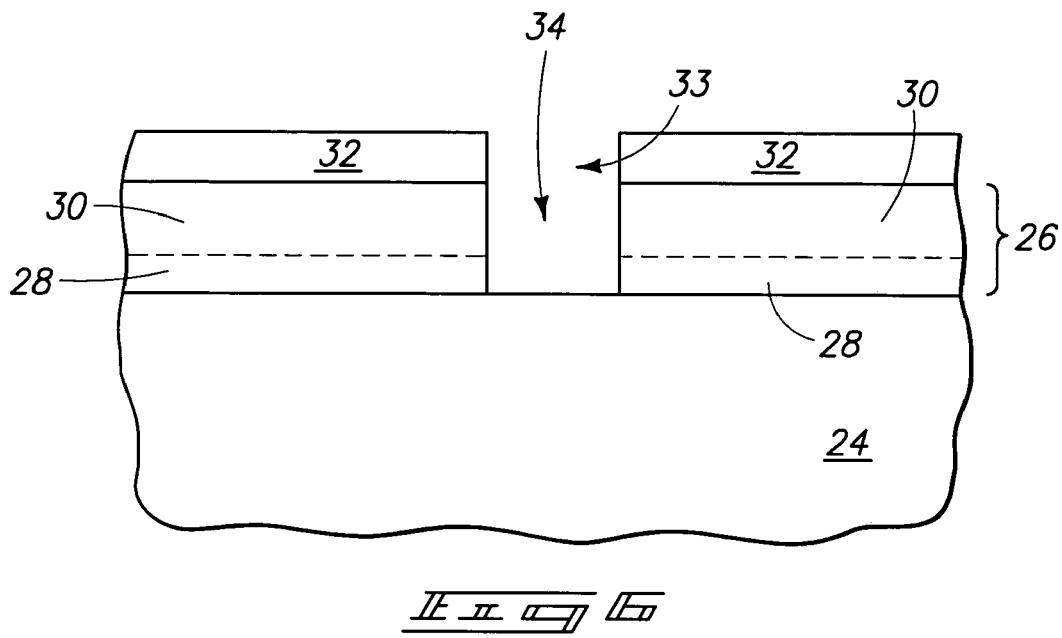
FIG. 6 is a view of the FIG. 5 substrate at a processing stage subsequent to that of FIG. 5.

An example material for masking layer 32 is photoresist. Any other masking material is contemplated, whether existing or yet-to-be developed. Multiple materials and layers are also contemplated for layer 32. In FIGS. 4-6, an exemplary method of forming contact openings is shown. Masking layer 32 has an opening 33 formed therein for defining a contact opening in material 26.

Figure 1:
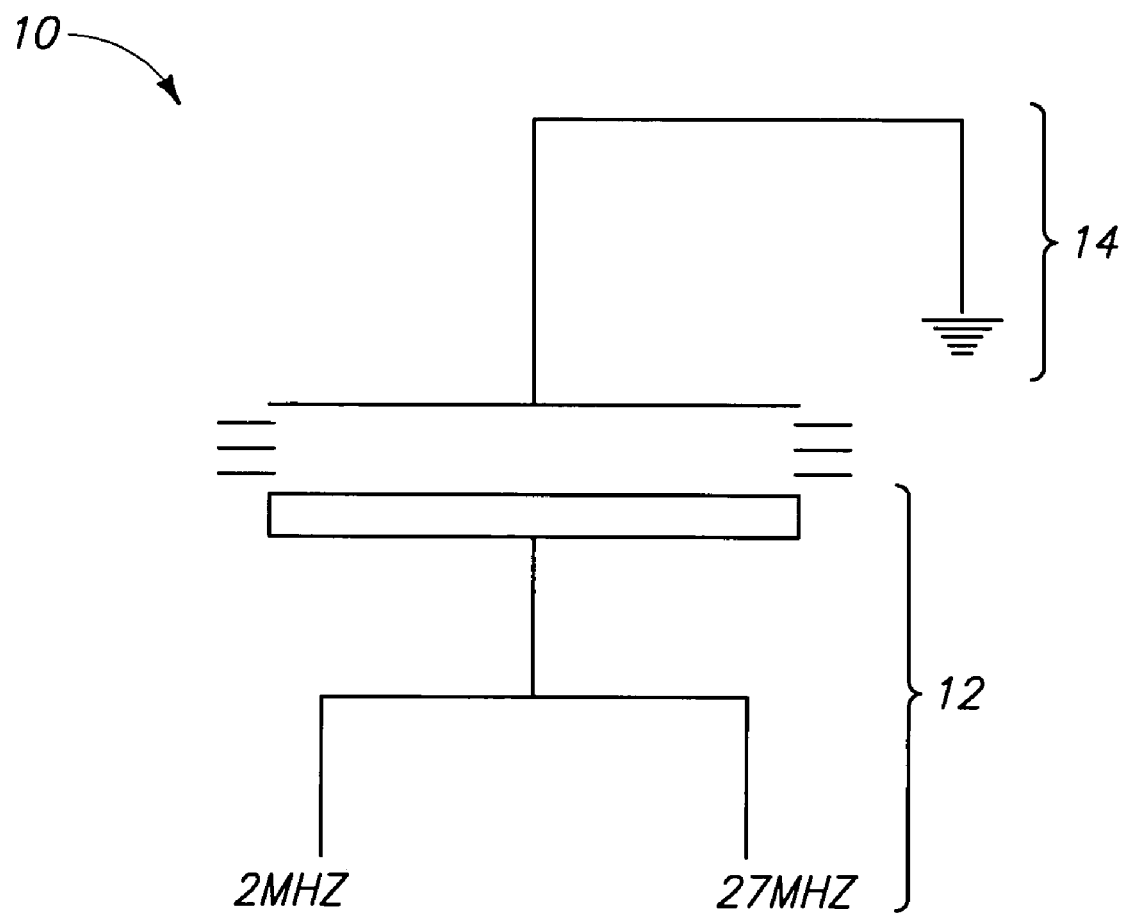
FIG. 1 is a diagrammatic depiction of a prior art bottom powered, dual frequency plasma chamber usable in accordance with aspects of the invention.
Figure 2:
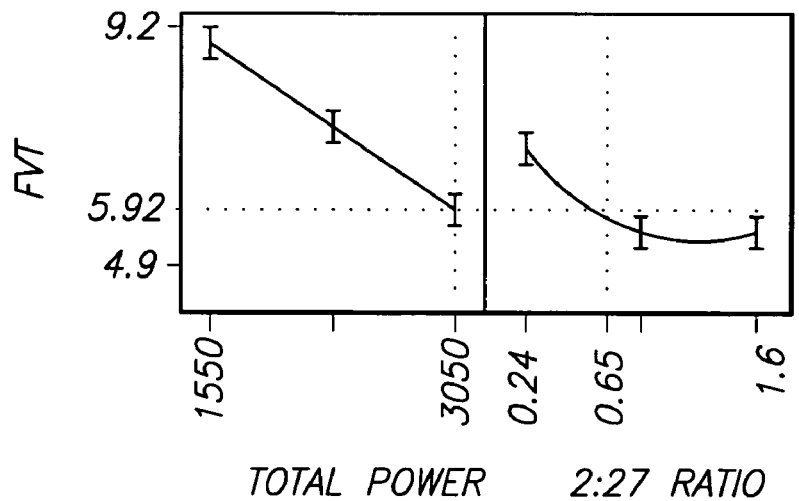
FIG. 2 is a graph of data obtained from a semiconductor substrate processed according to prior art methods.
Figure 2:
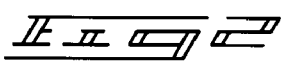
Figure 3:
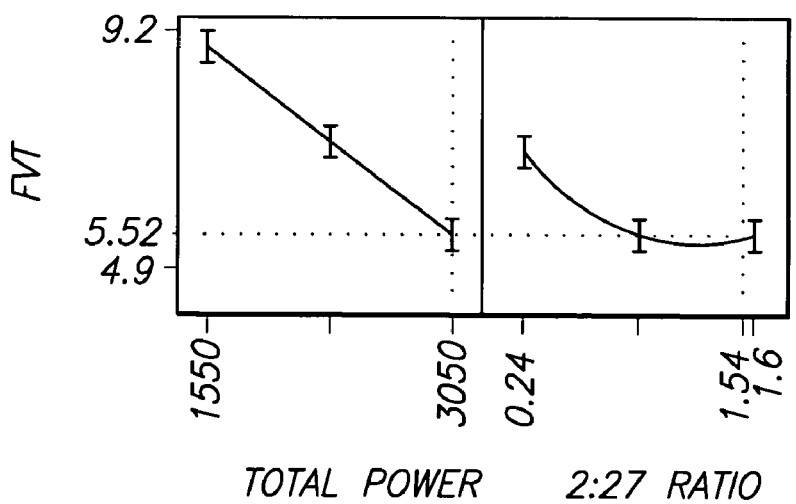
FIG. 3 is a graph of data obtained from a semiconductor substrate processed according to prior art methods.
Figure 3:

Substrate 20 is positioned over a plasma generating electrode of a bottom powered plasma chamber, for example as shown in FIG. 1. The Exelan dual frequency bottom powered etching system described above is an exemplary bottom powered plasma chamber. Regardless, the plasma generating electrode is powerable at different first and second frequencies, with the first frequency being lower than the second frequency. By way of example only, the first frequency can be 2 MHz and the second frequency can be 27 MHz as with the Exelan system.

Referring to FIG. 5, outermost portion 30 has been removed effective to expose innermost portion 28. Outermost portion 30 may be removed through a number of techniques. In one implementation, outermost portion 30 may be removed by plasma etching. Plasma may be generated over substrate 20 with the electrode from a first applied power at the first frequency and a second applied power at the second frequency. The first applied power and the second applied power can each be greater than 1000 watts during the removing, and a sum of the first applied power and the second applied power can be at least 3000 watts. In particular aspects, the first applied power can be 0 or greater than 0. In an exemplary aspect, when removing outermost portion 30, a ratio of the first applied power to the second applied power is from 0.26 to 5.9; from 0.6 to 1.67; and/or from 0 to 0.25 or at least 6.0. Further, etching might be conducted without plasma generation. Regardless, an exemplary etching chemistry for etching borophosphosilicate glass includes $C_4F_8$, $O_2$ and Ar.

Referring to FIG. 6, innermost portion 28 has been plasma etched to form contact opening 34. Plasma is generated over substrate 20 with the electrode from a first applied power at the first frequency and a second applied power at the second frequency. When etching innermost portion 28, the ratio of the first applied power to the second applied power is from 0 to 0.25 or at least 6.0. The first applied power can be 0 or greater than 0. The first applied power and the second applied power are preferably each greater than 1000 watts during the etching, and a sum of the first applied power and the second applied power is preferably at least 3000 watts.

In an exemplary aspect, the removing of outermost portion 30 removes at least five times the material as does the etching of innermost portion 28. In another aspect, the removing of outermost portion 30 removes at least nine times the material as does the etching of innermost portion 28. In one aspect, outermost portion 30 is removed at a higher rate than innermost portion 28 is etched.

In one implementation, the outermost portion and the innermost portion are both plasma etched. A sum of the applied powers utilized to etch the innermost portion can be less than a sum of the applied powers used to etch in the outermost portion. The applied powers used to etch the outermost portion, for example, can each be greater than 1000 watts and/or have a sum total greater of at least 3000 watts. In an exemplary aspect, one of the applied powers utilized to etch the innermost portion is equal to one of the applied powers utilized to etch the outermost portion.

Figure 7:
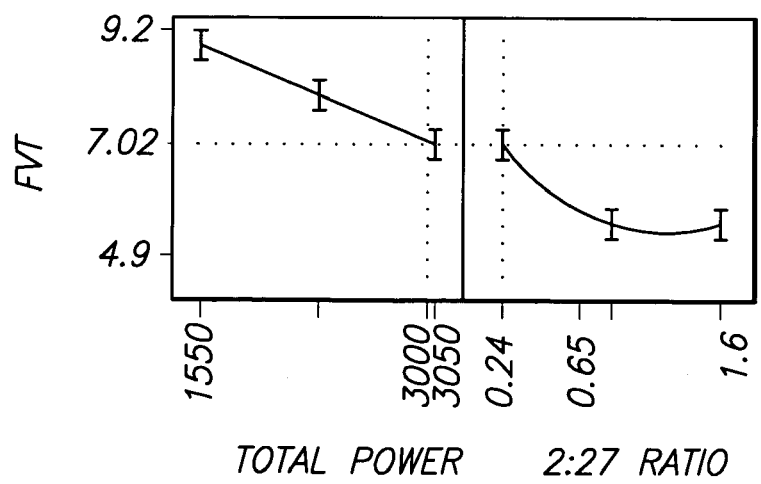
FIG. 7 is a graph of data obtained from a semiconductor substrate processed in accordance with aspects of the invention.

Referring to FIG. 7, the field threshold voltage of exemplary substrate 20 having contact openings 34 formed therein is illustrated. As is shown, the field threshold voltage is approximately seven as compared to the approximate five of the prior art.

The above exemplary described embodiment was with respect to exemplary aspects of methods of forming contact openings. However, the invention is in no way so limited. Rather, the invention in its broadest aspect can be considered as a plasma etching method wherein a substrate is positioned over a bottom powered plasma generating electrode of a bottom powered plasma chamber. The bottom powered electrode is powerable at different first and second frequencies, with the first frequency being lower than the second frequency. Plasma is generated over the substrate with the electrode from a first applied power at the first frequency and a second applied power at the second frequency. A ratio of the first applied power to the second applied power is from 0 to 0.25, or at least 6.0. Material is etched from the substrate with the plasma. Accordingly, the invention is contemplated as just so literally stated and independent of whether contact openings or other openings are being formed relative to a substrate. Preferred attributes with respect to the plasma etching are otherwise as variously stated above.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A plasma etching method comprising:
    positioning a substrate over a plasma generating electrode, the electrode powerable at different first and second frequencies, wherein a surface of the substrate comprises an outermost portion over an innermost portion, the outermost portion being at least five times the thickness of the innermost portion;

generating one plasma over the substrate to expose at least a portion of the innermost portion, the plasma being generated with the electrode from a first applied power at the first frequency and a second applied power at the second frequency, a ratio of the first applied power to the second applied power being from 0.26 to 5.9; and after exposing the portion of the innermost portion, generating another plasma over the substrate to remove at least some of the innermost portion, the plasma being generated with the electrode from a third applied power at the first frequency and a fourth applied power at the second frequency, a ratio of the third applied power to the fourth applied power being from 0 to 0.25 or at least 6.0, wherein the outermost portion is removed at a higher rate than the innermost portion.

2. The method of claim 1 wherein the first frequency comprises 2 MHz and the second frequency comprises 27 MHz.

3. The method of claim 1 wherein the first applied power and the second applied power are each greater than 1000 watts.

4. The method of claim 1 wherein a sum of the first applied power and the second applied power is at least 3000 watts.

5. The method of claim 1 wherein the first applied power is zero.

6. The method of claim 1 wherein the first applied power is greater than zero.

7. The method of claim 1 wherein during the generating of the one plasma over the substrate to expose at least a portion of the innermost portion, the ratio of the first applied power to the second applied power is from 0.6 to 1.67.

8. The method of claim 1 wherein both the outermost and innermost portions comprise insulative material.

9. The method of claim 1 wherein the outermost portion is at least nine times the thickness of the innermost portion.

10. The method of claim 1 wherein a sum of the first applied power and the second applied power is greater than a sum of the third applied power and the fourth applied power.

11. The method of claim 1 wherein the innermost portion comprises $SiO_2$.

12. The method of claim 11 wherein the outermost portion comprises borophosphosilicate glass.

* * * * *